United States Patent [19]
Nishizawa et al.
[11] 3,896,484
[45] July 22, 1975

[54] INTRINSIC SEMICONDUCTOR CHARGE TRANSFER DEVICE USING ALTERNATE TRANSFER OF ELECTRONS AND HOLES

[76] Inventors: Jun-ichi Nishizawa, No. 6-16, Komegafukuro 1-chome; Termumoto Nonaka, c/o Mrs. Sadako Goto, No. 14-5, Otamaya-shita, both of Sendai, Japan

[22] Filed: Feb. 6, 1974

[21] Appl. No.: 439,865

Related U.S. Application Data

[63] Continuation-in-part of Ser. No. 186,236, Oct. 4, 1971, abandoned.

[30] Foreign Application Priority Data

Oct. 6, 1970 Japan ................................ 45-87649

[52] U.S. Cl. ..................... 357/24; 307/304; 357/45; 357/58

[51] Int. Cl. ............................................ H01l 11/14

[58] Field of Search ....................................... 357/24

[56] References Cited

UNITED STATES PATENTS

| | | | |
|---|---|---|---|
| 3,513,403 | 5/1970 | Chang | 307/303 |
| 3,562,425 | 2/1971 | Poirier | 250/211 |
| 3,700,932 | 10/1972 | Kahng | 357/24 |

OTHER PUBLICATIONS

W. S. Boyle et al. "Charge Coupled Semiconductor Devices" B.S.T.J. Briefs, April 1970, pp. 587–593.

*Primary Examiner*—Martin H. Edlow
*Assistant Examiner*—Gene M. Munson
*Attorney, Agent, or Firm*—Robert E. Burns; Emmanuel J. Lobato; Bruce L. Adams

[57] ABSTRACT

A semiconductor data transmission device having an MIS structure including an intrinsic semiconductor and a plurality of metallic electrodes disposed in a predetermined pattern on its insulating layer. One of the electrodes serves as a gate electrode for injecting both groups of positive polarity carriers and groups of negative polarity carriers successively into the semiconductor and the remaining electrodes are interconnected by a time delay line. A pulse is applied to one end of the time delay line connected to that electrode nearest to the gate electrode to simultaneously transfer those groups of positive carriers and those groups of negative carriers injected into the semiconductor. A low frequency voltage is supplied to a particular one of the electrode to form carriers opposite in polarity from the moved carriers below it to extinguish the latter through the recombination.

9 Claims, 23 Drawing Figures

FIG. 6 ($t_1$)
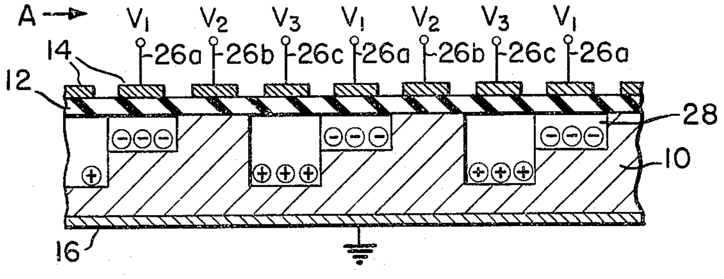
FIG. 6 ($t_2$)
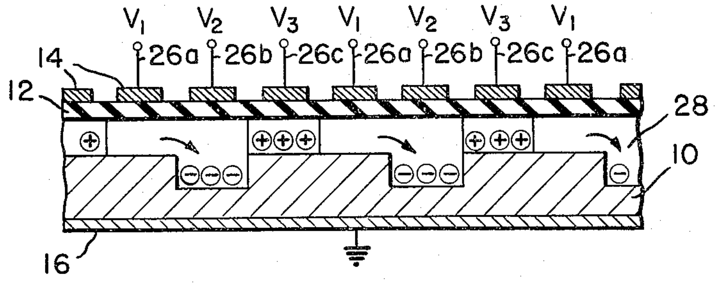
FIG. 6 ($t_3$)
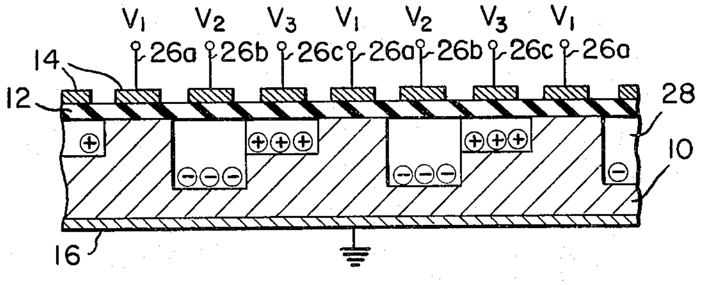
FIG. 6 ($t_4$)
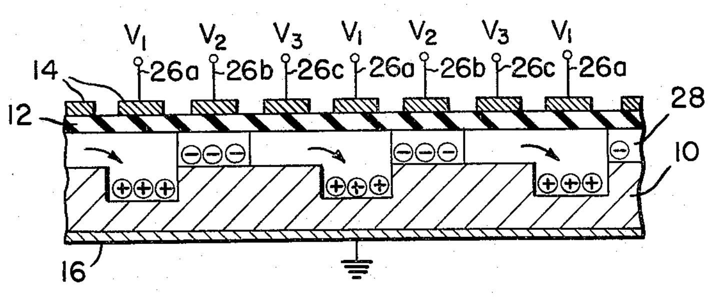
FIG. 6 ($t_5$)
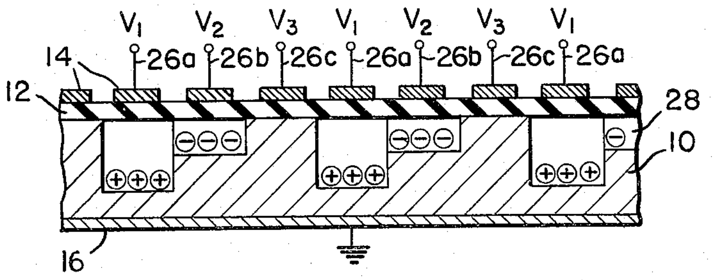
FIG. 6 ($t_6$)
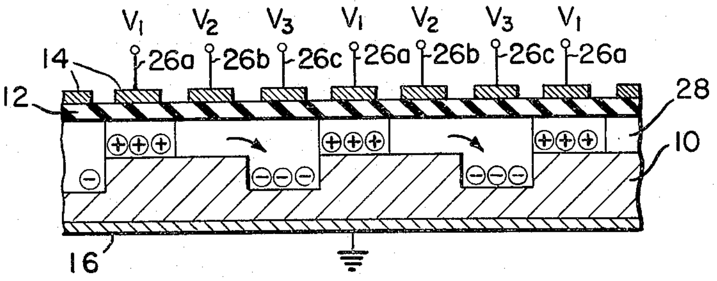

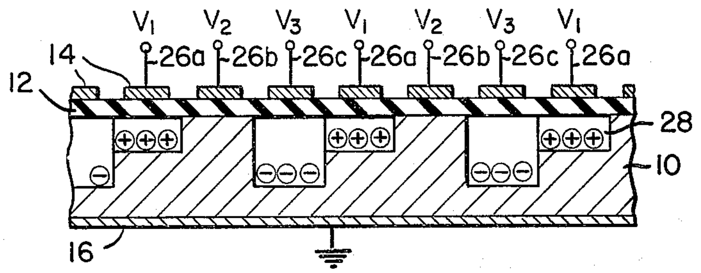
FIG. 6 ($t_7$)
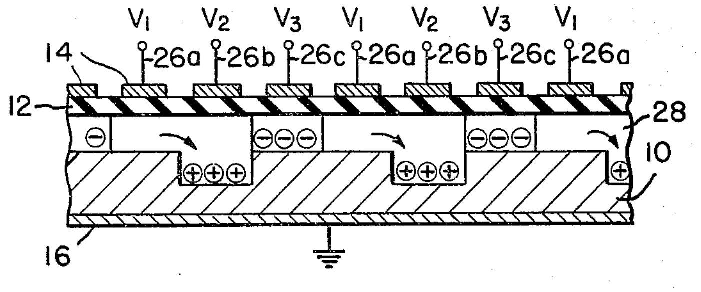
FIG. 6 ($t_8$)
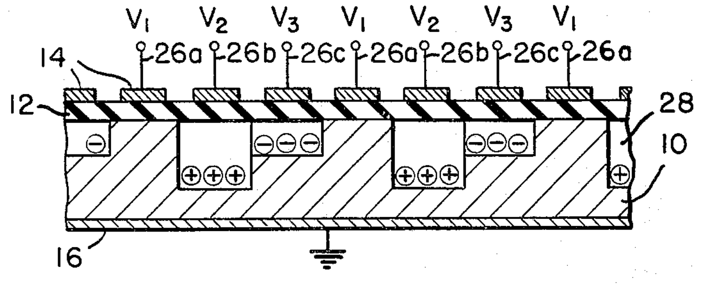
FIG. 6 ($t_9$)
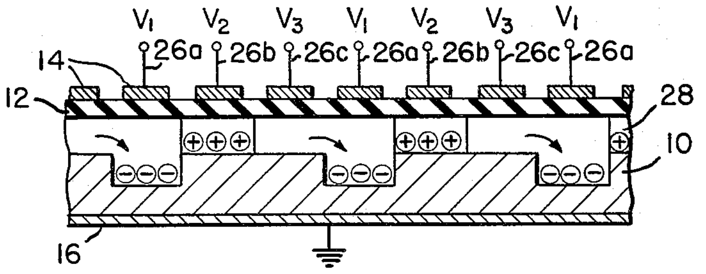
FIG. 6 ($t_{10}$)
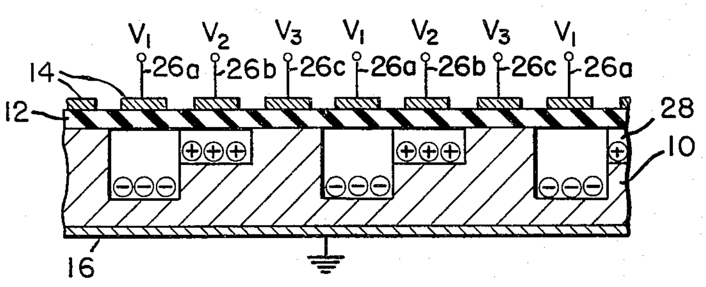
FIG. 6 ($t_{11}$)
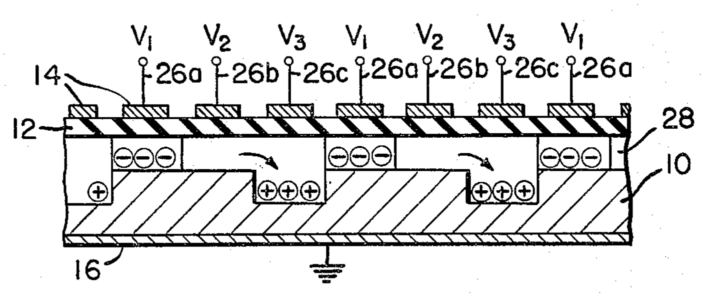
FIG. 6 ($t_{12}$)

INTRINSIC SEMICONDUCTOR CHARGE TRANSFER DEVICE USING ALTERNATE TRANSFER OF ELECTRONS AND HOLES

CROSS REFERENCE TO A RELATED APPLICATION

This application is a continuation-in-part of U.S. application Ser. No. 186,236, filed on Oct. 4, 1971, now abandoned.

BACKGROUND OF THE INVENTION

The present invention relates to improvements in a semiconductor data transmission device utilizing an MIS structure.

The MIS (metal-insulator-semiconductor) structure utilized by conventional semiconductor data transmission devices includes the p or n type semiconductive material, and three conductors for applying voltage signals pulses to electrodes formed on the metal layer and disposed in the direction of data transmission. In this manner data transmitted through the device.

SUMMARY OF THE INVENTION

The object of the present invention is to provide an improved semiconductor data transmission device having an MIS structure that is capable of simultaneously transferring both positive and negative polarity injected carriers therethrough.

Another object of the present invention is to provide a semiconductor data transmission device having a simple construction and a reliable operation.

These and other objects of the present invention are achieved by a semiconductor data transmission device comprising, in combination, a substrate of intrinsic semiconductive material having a pair of opposite main faces, a layer composed of electrically insulating material disposed on one of the main faces of the substrate, a plurality of metallic electrodes disposed in spaced-apart relationship in a predetermined pattern on the surface of the electrically insulating layer, a metallic electrode disposed on the other main face of the substrate, means for selectively injecting both groups of positive polarity carriers and groups of negative polarity carriers successively into the intrinsic semiconductive substrate, time delay means connected to the plurality of electrodes on the surface of the electrically insulating layer and responsive to both positive and negative voltage pulses selectively and successively applied to one end thereof to simultaneously transfer through the substrate those groups of positive polarity and those groups of negative polarity carriers that have been injected into the substrate, and means operatively coupled to a selected one of the electrodes on the insulating layer for controlling the transfer of the groups of injected carriers through the substrate.

BRIEF DESCRIPTION OF THE DRAWINGS

The invention will become more readily apparent from the following description taken in conjunction with the accompanying drawing in which:

FIGS. 6 $(t_1)$–$(t_{12})$ are fragmental sectional views of the device shown in FIG. 4 illustrating the carrier state and potential wells varying with time;

Throughout the Figures like reference numerals designate the corresponding or similar components.

DESCRIPTION OF THE PREFERRED EMBODIMENTS

Figures 1, 2:
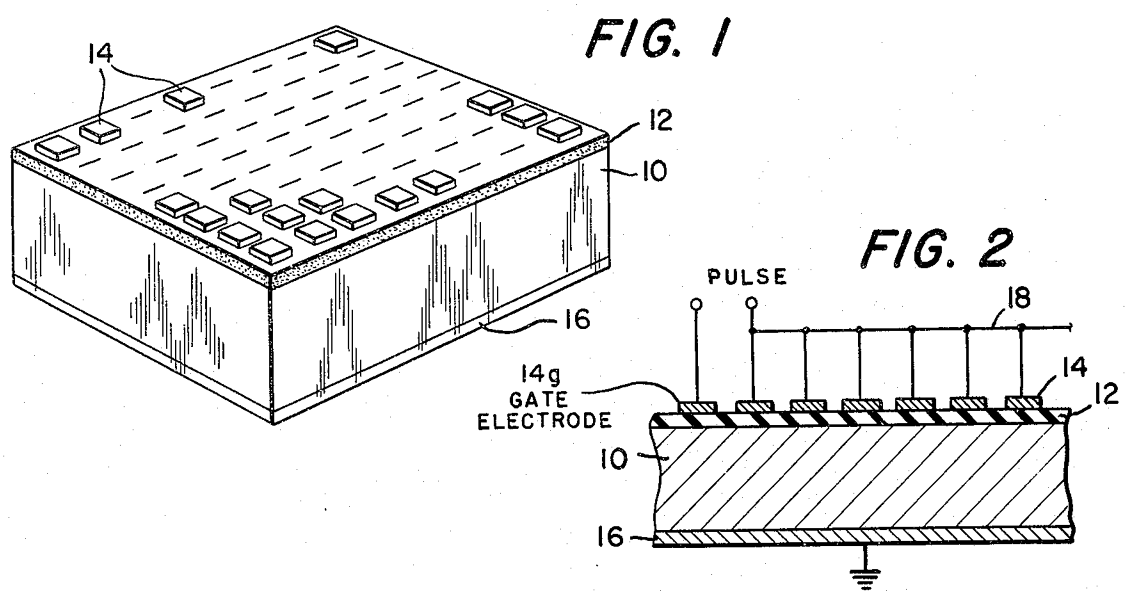
FIG. 1 is a fragmental perspective view of a semiconductor data transmission device constructed in accordance with the principles of the invention.
FIG. 2 is a fragmental sectional view of a modification of the invention in which insulating gate electrodes involved are driven by a time delay circuit to transfer electrons and holes.

Referring now to the drawing and FIG. 1 in particular, it is seen that the arrangement disclosed therein comprises a substrate or wafer 10 composed of intrinsic semiconductive material such as silicon having a pair of opposite main faces, and an layer 12 of any suitable electrically insulating material disposed on one of the main faces of the subtrate 10, in this case, the upper face as viewed in FIG. 1, and a plurality of metallic electrodes 14 disposed in rows and columns on the exposed surface of the insulating layer 12 to form an MIS structure. The electrodes may be arranged in any other desired pattern other than that illustrated. As shown in FIG. 1, the substrate 10 has a metallic electrode 16 attached to the other face thereof covering the entire area.

As best shown in FIG. 1, a selected one of the spaced electrodes 14, in this example, the leftmost electrode 14*g* as viewed in the Figure is caused to serve as a gate electrode and the remaining electrodes 14 are interconnected by a time delay line 18 which may be of any desired construction well known in the art. The time delay line 18 has one end connected to that electrode 14 nearest to the gate electrode 14*g*.

In operation, a predetermined voltage is applied across the gate electrode 14*g* and the lower electrode 16 to form an inversion layer within a depletion layer formed on the boundary surface of the substrate 10 contacting the insulating layer 12 and on that portion of substrate disposed adjacent the boundary surface thereby to externally inject the carriers equal in polarity to those in the inversion layer into the latter. Then the injected carriers are accumulated in the inversion layer.

On the other hand, a voltage pulse is applied to one end of the time delay line 18 connected to the electrode 14 next to the gate electrode 14*g*. This results in the transfer of the carriers accumulated below the gate electrode 14*g* to that the electrode 14 next thereto.

The voltage pulse travels along the time delay line 18 so that the pulse appearing at each electrode 14 is applied to the next succeeding electrode 14 with a fixed time delay predetermined by the time constant of that portion of the time delay line 18 disposed between the two electrodes 14. At that time, the process as above described is repeated with that electrode until the injected carriers are transferred in succession through the substrate. In other words, data is transmitted through the device.

It will readily be understood that with the carriers accumulated below a particular one of the electrodes 14, the capacitance between that electrode 14 and the lower electrode 16 increases. This increase in capacitance can be easily determined by any suitable means for measuring capacitances in well known manner although it is not illustrated in FIG. 2.

Therefore it will be appreciated that the present device can be effectively used as a shift register or a logic circuit.

Since the substrate 10 is composed of an intrinsic semiconductive material, the type of the carriers to be transferred can be selected in accordance with the polarity of the voltage pulse applied to the time delay line 18 at one end. That is, the electrons and holes can be transferred at will in accordance with the polarity of the pulse voltage applied to the time delay line. For example, the application of a positive voltage causes the transfer of the electrons while the application of a negative voltage causes the transfer of the holes. In order to permit the applied voltage to be low, the substrate 10 is preferably very thin because it presents a high resistance to the voltage.

Figure 3A:
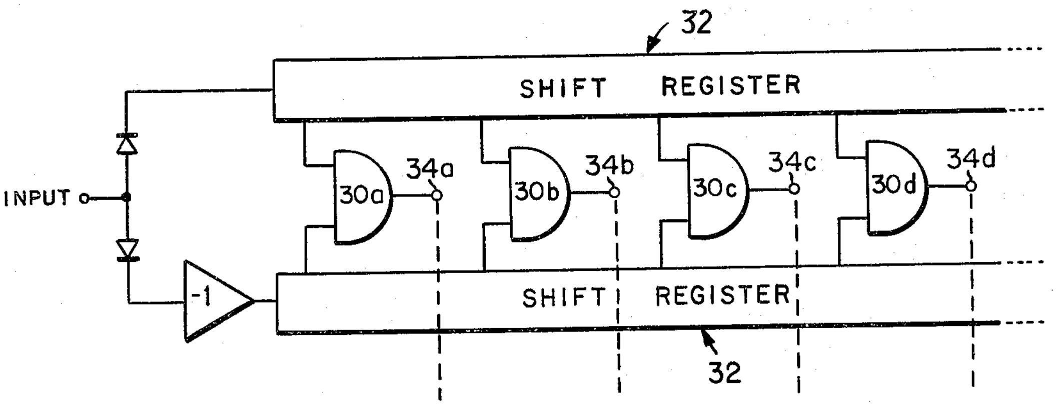
FIGS. 3*a* and 3*b* are respectively a plan and a sectional view of one portion of an arrangement for practically operating the device shown in FIG. 2.
Figure 3B:
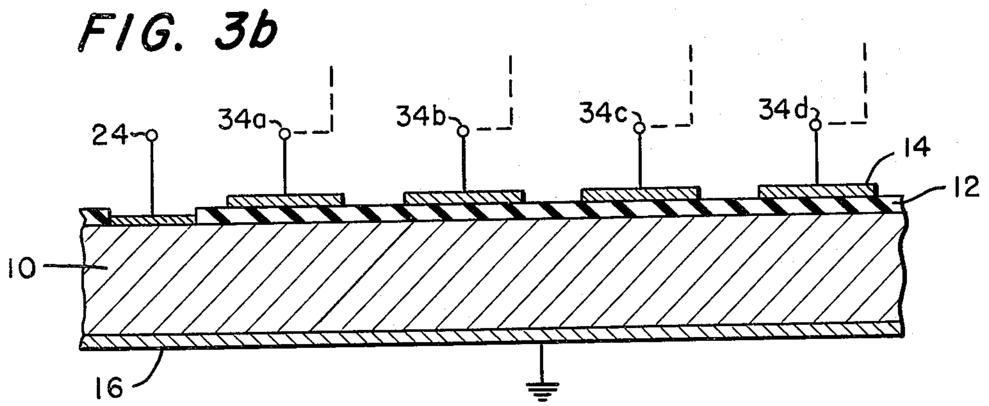

FIGS. 3*a* and 3*b* show an arrangement for simultaneously transmitting a positive and a negative signal by simultaneously transferring both holes and electrons. A time delay line comprises a pair of shift registers 32 which has the output of each stage connected to one adder 30*a*, 30*b*, 30*c* or 30*d*. The output of each adder is connected to one insulating gate electrode 34*a*, 34*b*, 34*c* or 34*d*. As a result, both positive or negative pulses are time delayed in an incremental manner and successively applied to the insulating gate electrodes to transfer either or both electrons and holes.

Figure 4:
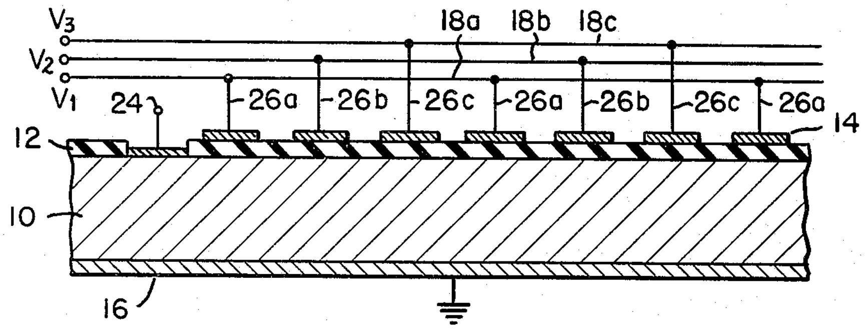
FIG. 4 is a fragmental sectional view of another modification of the invention in which clock pulses are applied to insulating gate electrodes involved to transfer the electrons and holes.

FIG. 4 shows another data transmission device of the invention through which the electrons and holes are continuously transmitted or transferred. The arrangement illustrated comprises a substrate 10 of intrinsic semiconductive material, an insulating layer 12 disposed on the substrate 10, a plurality of metallic electrodes 14 disposed at substantially equal intervals on the insulating layer 12 and a metallic electrode 16 disposed on that face of the substrate opposite to the insulating layer 12. Then each of three conductors 18*a*, 18*b* or 18*c* is connected to every third one of the electrodes 24 through a lead 26*a*, 26*b* or 26*c* respectively. In order to inject the electrons and holes into the substrate 10, an input gate electrode 24 is disposed in ohmic contact with the substrate 10. The input gate electrode 24 may comprise a terminal connected in parallel to a P type region and an N type region disposed in juxtaposed relationship on the substrate 10. Alternatively, irradiation with light may be utilized.

Figure 5:
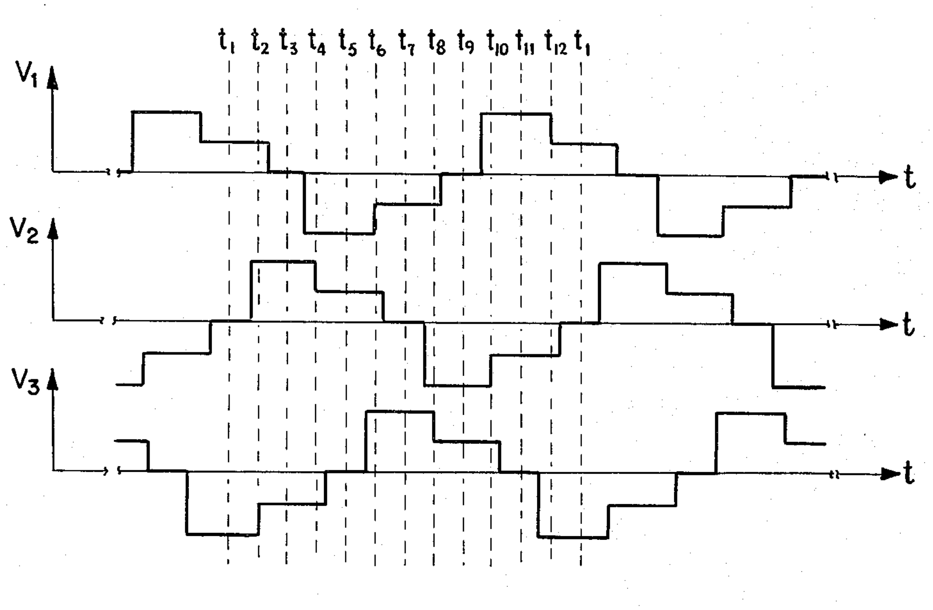
FIG. 5 is a graph illustrating waveforms of clock pulses for driving the device shown in FIG. 4.

In order to transmit the electrons and holes through the arrangement of FIG. 4, the conductors 18*a*, 18*b* and 18*c* can apply to the associated electrodes 24 clock pulses having waveforms $V_1$, $V_2$ and $V_3$ shown in FIG. 5. Alternatively a three phase alternating current can be used. If desired, the clock pulses may have sawtoothed waveforms having a positive and a negative magnitude rather than the stepped waveforms as shown in FIG. 6. The electrons and holes injected into the substrate from the input gate electrode 24 respond to the clock pulses applied to the electrodes 24 to be successively moved in the direction of the arrow A shown in FIG. 6 through the substrate 10 with time as shown in FIG. 6. FIG. 6 shows the carrier state and the associated potential well at each of time points $t_1, t_2, \ldots, t_{12}$ shown in FIG. 5. That is, the process proceeds in the order of FIGS. 6($t_1$), 6($t_2$) . . . , 6($t_{12}$) corresponding to the time points $t_1, t_2, \ldots, t_{12}$.

By suitably selecting the waveform of the clock pulse, any waveform having a positive or a negative magnitude can be transmitted through the substrate 10 with incremental time delays.

From the foregoing it will be appreciated that the present device can selectively and simultaneously transfer the electrons and the holes therethrough.

Figure 7A:
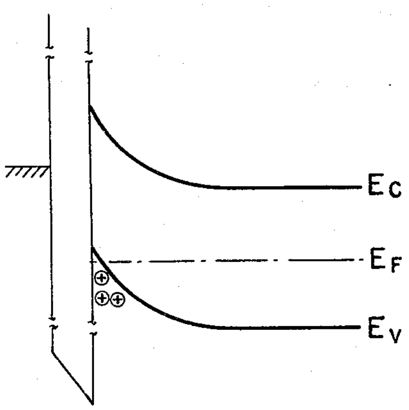
FIGS. 7*a* and 7*b* are representations of the energy bands during the operation of the device shown in FIG. 4.
Figure 7B:
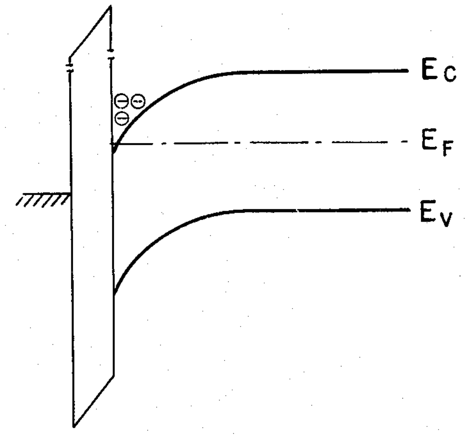

FIG. 7*a* shows energy bands perpendicular to the surface for a region below the metallic electrode 26*c* at a time point $t_1$, shown in FIG. 6 in the negatively biased state and FIG. 7*b* shows energy bands perpendicular to the surface for a region below the metallic electrode 26*a* at a time point $t_1$, shown in FIG. 6 in the positively biased state.

$E_C$ designates an energy level for a conduction band of a semiconductive material and $E_V$ designates an energy level for a filled band, $E_F$ is a Fermi level. From FIGS. 7*a* and 7*b* it is apparent that the electric charges that are transferred can be accumulated in respective regions.

Figure 8:
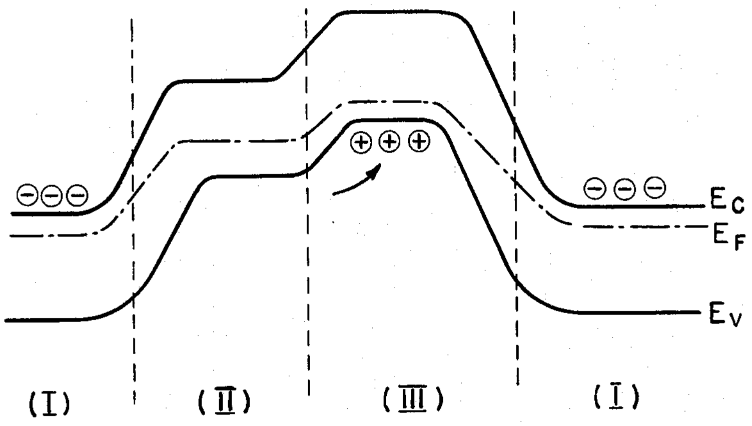
FIG. 8 is another representation of the energy bands of the device shown in FIG. 4.

FIG. 8 shows energy bands on the surface in a direction parallel to the surface and at a time point $t_{12}$ shown in FIG. 6. (I), (II) and (III) designate regions having voltages $V_1$, $V_2$ and $V_3$ applied respectively at the time point $t_{12}$. As seen in FIG. 8 reverse biases are applied between the regions (I) and (II) and between the regions (III) and (I) while a forward bias is applied between the regions (II) and (III). This causes the holes to be transferred from the region (II) to the region (III). Because of the reverse bias applied between the regions (III) and (I), the transferred holes are scarcely lost due to the recombination with the electrons and are negligible as compared with the signal charge.

Figure 9:
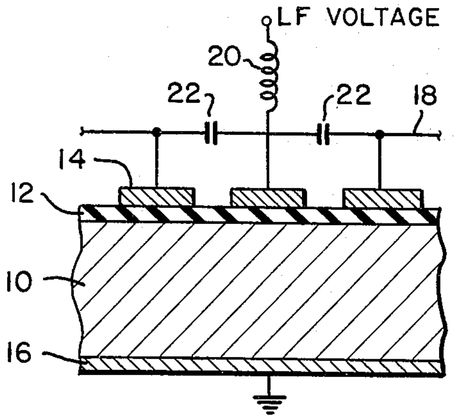
FIG. 9 is a view similar to FIG. 2 but illustrating another modification of the invention.

As shown in FIG. 9, a selected one of the electrodes 14 may have, applied thereto a voltage with such a polarity that those carriers reverse in polarity from the carrier to be later transferred are formed on that portion of the substrate disposed directly below the electrode and adjacent the insulating layer 12. For example, if what is transferred is the holes, the electrons may be formed. Under these circumstances, the carriers transferred through the substrate 10 are recombined with the carriers thus formed to disappear preventing a further transfer of the carriers that is, a further transmission of data.

For example, the application of a low frequency voltage to a selected one of the electrodes 14 enables the transfer of the carriers to be controlled by using an arrangement such as shown in FIG. 9. The arrangement illustrated comprises an inductor 20 connected to a selected one of the electrodes 14 and one capacitor 22 connecting that electrode 14 to each of the adjacent electrodes 14 connected to the time delay line 18.

The inductor 20 serves to prevent the low frequency voltage applied to the selected electrode 14 from affecting the pulse passing through the capacitors 22 while at the same time each of the capacitors 22 prevents the same voltage from being applied to the adjacent electrode.

Alternatively, a voltage may be applied to a selected one of the electrodes 14 sufficient to establish on that portion of the substrate 10 disposed below that electrode an electric field for preventing those carriers transferred thereto from further moving to below the next succeeding electrode.

Figure 10:
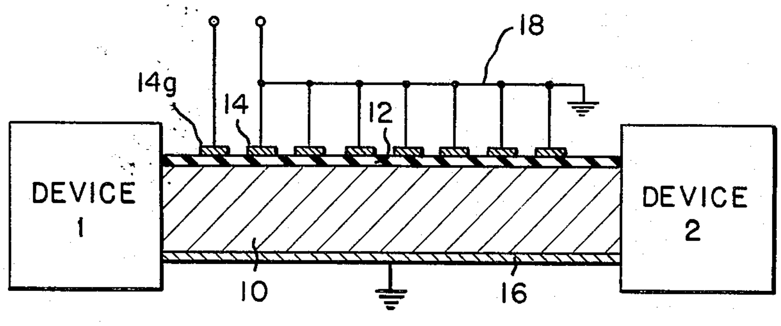
FIG. 10 is a sectional view of another embodiment of the present invention.

The embodiment shown in FIG. 10 relates to the use of the semiconductor data transmission device to transfer a digital signal (or carriers) from the output of a device 1 to a device 2 as shown therein. The output signal from device 1 can comprise both holes and electrons. The two polarities of carrier signal can be selectively transferred from the device 1 to the device 2 through this single semiconductor data transmission device. The transmission is effected by pulses applied to the electrodes 14 on the substrate that have the proper polarity to permit the signal formed of one type of the carriers, that is, the holes or the electrons to be transmitted from the device 1 to the device 2.

In order to prevent the semiconductor data transmission device connected to the output of the device 1 from affecting the device 1, for example, from changing the output impedance thereof, the gate electrode is provided.

If pulses forming the output signal from the device 1 are different in duration from those pulses transmitted through the semiconductor data transmission device, then all the carriers forming that output signal may be not injected into the transmission device. To avoid this, the gate electrode 14*g* is operative to be opened for a time interval equal to the duration of the output pulses for the purpose of accumulating all the carriers.

While the invention has been described in conjunction with a few preferred embodiments thereof it is to be understood that numerous changes and modifications may be resorted to without departing from the spirit and scope of the invention. For example, the injection of the carriers may be accomplished through the application of a forward voltage across a pn junction involved, the avalanche injection, the irradiation of radioactive ray or light ray etc. The arrangement of FIG. 9 may be of a distributed constant type and also disposed on a notched portion formed in the insulating layer.

What we claim is:

1. A semiconductor data transmission device for transmitting groups of carriers each corresponding to digital data comprising: a substrate composed of intrinsic semiconductive material having a pair of opposite main faces; a layer composed of electrically insulating material disposed on one of said main faces of said substrate; a plurality of metallic electrodes disposed in spaced-apart relationship in a predetermined pattern on the surface of the electrically insulating layer; a metallic electrode disposed on the main face of said substrate; means for selectively injecting both groups of positive polarity carriers and groups of negative polarity carriers successively into said intrinsic semiconductive substrate; and time delay means connected to said plurality of metallic electrodes disposed on the surface of said electrically insulating layer and responsive to both positive and negative voltage pulses selectively and successively applied to one end thereof for delaying the voltage pulses to apply each in succession to each of said plurality of electrodes to simultaneously transfer through the substrate those groups of positive polarity carriers and those groups of negative polarity carriers that have been injected into the substrate.

2. A semiconductor data transmission device as claimed in claim 1, wherein said means for selectively injecting both groups of carriers comprise a gate electrode disposed on said electrically insulating layer and said metallic electrode on said other main face of said substrate for receiving a voltage thereacross.

3. A semiconductor data transmission device as claimed in claim 1, further comprising means coupled to a selected one of said electrodes on said electrically insulating layer for controlling the transfer of the groups of injected carriers through the substrate.

4. A semiconductor data transmission device as claimed in claim 1, wherein said means for injecting the groups of carriers comprises a gate electrode disposed on said electrically insulating layer and said metallic electrode on said other main face of said substrate receptive of a voltage thereacross, and wherein said time delay means comprises a time delay line having one end thereof connected to the electrode disposed on said electrically insulating layer and nearest to said gate electrode.

5. A semiconductor data transmission device according to claim 4, wherein said time delay line comprises two multistage shift registers and a plurality of adders each receptive of the output of the same stage of both shift registers and having the output thereof connected to one of said electrodes.

6. A semiconductor data transmission device as claimed in claim 1, further comprising control means for controlling the transfer of the groups of injected carriers through said substrate including an inductor receptive of a low frequency voltage applied thereto and connected to a selected one of said plurality of electrodes disposed on said electrically insulating layer, and two capacitors each connected to said selected electrode and each connected to one of the electrodes adjacent to said selected electrode.

7. A semiconductor data transmission device according to claim 1, further comprising control means coupled to a selected one of said plurality of electrodes for effecting recombination of the groups of carriers to be transferred from the selected electrode with carriers of the opposite polarity to inhibit the transfer of the groups of carriers to succeeding electrodes thereby controlling the transfer of the groups of carriers.

8. A semiconductor data transmission device according to claim 1, wherein said time delay means comprises three conductors each connected a different group of every three electrodes and each receptive of a clock pulse train applied thereto wherein each clock pulse train is out of phase with the other two.

9. A semiconductor data transmission device according to claim 1, wherein said means for injecting carriers into said substrate comprises a first semiconductor device connected thereto.

* * * * *